United States Patent [19]

Loprest et al.

[11] 4,132,549

[45] Jan. 2, 1979

[54] IMAGING SYSTEM

[75] Inventors: Frank J. Loprest, Binghamton, N.Y.; Eugene F. McInerney, Chagrin Falls, Ohio

[73] Assignee: GAF Corporation, New York, N.Y.

[21] Appl. No.: 743,476

[22] Filed: Nov. 19, 1976

[51] Int. Cl.² ............................................. G03C 1/72
[52] U.S. Cl. ............................................ 96/35; 96/67; 96/88; 526/53; 526/346; 96/115 R; 528/392
[58] Field of Search ................... 526/11.1, 346, 53; 96/35.1, 35, 67, 88

[56] References Cited

U.S. PATENT DOCUMENTS

| 3,864,293 | 2/1975 | Miyoshi et al. | 526/346 |
| 3,963,791 | 6/1976 | Giuffre et al. | 526/53 |

OTHER PUBLICATIONS

Mayo et al., J.A.C.S., vol. 78, pp. 1023–1034, 3-5-56.

*Primary Examiner*—John D. Welsh
*Attorney, Agent, or Firm*—Walter C. Kehm; Edward G. Comrie

[57] ABSTRACT

A photo-induced thermally degradable imaging system comprising a continuous, water-insoluble film of a peroxide copolymer of oxygen and a vinyl aromatic monomer having the structural formula:

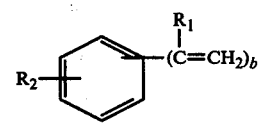

wherein $R_1$ can be hydrogen or an alkyl group containing from 1 to 4 carbon atoms, $R_2$ is hydrogen, an alkyl group containing from 1 to 4 carbon atoms, an aryl group containing from 6 to 12 carbon atoms or a halogen atom and b is an integer from 1 to 2, on a substrate.

10 Claims, No Drawings

IMAGING SYSTEM

This invention relates to a polymeric imaging system in which images are formed through photo-induced thermal degradation of the polymer. More particularly, this invention relates to an imaging system based upon the photo-induced thermal degradation of a peroxide copolymer of oxygen and a vinyl aromatic compound.

Imaging systems heretofore developed have relied primarily on photopolymerization and photo cross-linking techniques for photo-resist, lithographic, and other imaging applications.

Imaging systems based on the thermal decomposition of a polymers offer several advantages over prior photopolymerization or photo cross-linking systems. Imaging systems based upon thermal decomposition of polymers can, through simple modifications, provide either positive-working or negative-working systems as opposed to the conventional photopolymerization or photo crosslinking systems which are primarily negative-working. This is particularly significant since only one important chemically based, non-electrophotographic system—namely, the diazo system—is positive working; however this system is speed limited as it provides no amplification of the effect of the incident radiation.

Prior attempts to provide imaging systems which utilize polymer degradation have been rather complex and have involved relatively long exposure times. For instance, Plambeck in U.S. Pat. No. 2,892,712 discloses a process for preparing images by the photodegradation of various polymers, preferably those having a carbon-to-carbon chain but also including unstabilized formaldehyde polymers. This imaging system requires the use of various photopolymerization catalysts or initiators. During exposure, this system requires the presence of a coating of a liquid solvent or swelling agent on the surface of the imaging element. This is necessary because the polymer degradation process tends to be reversible. In addition, development of the resulting image involves the use of liquid developers. Exposure times with such systems are very long because polymer degradation essentially terminated when the radiation source was removed since this system provided no amplification of the effect of the incident radiation.

Accordingly, it is an object of the present invention to provide an imaging system with amplification by reason of the photo-initiated, thermally assisted degradation, suitable for application as an imaging system for reproduction of line copy by contact, reflection or reflex exposure.

It is another object of the present invention to provide an imaging system which can easily be operated as either a positive-working or negative-working system.

These as well as other objects are accomplished by the present invention which provides a photo-induced thermally degradable imaging system comprising a continuous water-insoluble film of a peroxide copolymer of oxygen and a vinyl aromatic monomer having the structural formula:

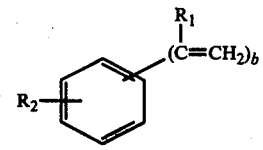

wherein $R_1$ is hydrogen or an alkyl group containing from 1 to 4 carbon atoms, $R_2$ is hydrogen, an alkyl group containing from 1 to 4 carbon atoms, an alkyl group containing from 6 to 12 carbon atoms or a halogen atom and b is an integer from 1 to 2, on a substrate.

The thermally degradable peroxide copolymers employed in the present invention provide the basis for a unique imaging system. The copolymers are prepared by copolymerization of a vinyl aromatic monomer having the structural formula:

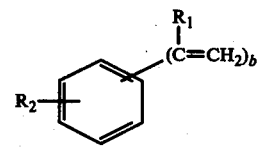

wherein $R_1$ is hydrogen or an alkyl group containing from 1 to 4 carbon atoms such as methyl, ethyl, isopropyl, normal propyl, isobutyl, normal butyl, t-butyl and the like, $R_2$ is hydrogen, an alkyl group containing from 1 to 4 carbon atoms such as those illustrated hereinabove with respect to $R_1$, an aryl group containing from 6 to 12 carbon atoms such as phenyl or naphthyl, or a halogen atom such as chlorine, bromine, iodine or fluorine, and b is an integer from 1 to 2. Typical of the vinyl aromatic monomers which can be suitably employed in the copolymerization processes of the present invention are styrene, α-methyl styrene, divinyl benzene, 4-methylstyrene, 4-ethylstyrene, 4-isopropylstyrene, 4-tert-butylstyrene and the like. These vinyl aromatic monomers can be copolymerized in the presence of streams of oxygen by stirring mixtures of vinyl aromatic monomer and initiator (for example, α,α'-azobisisobutyronitrile) for 24 hours at 50° C., followed by dissolving in a solvent for the polymer and then precipitating with a nonsolvent for the polymer.

The peroxide copolymers employed in the imaging system of the present invention can be conveniently dissolved in organic solvents which are inert with respect to the copolymer and with respect to the substrate upon which such copolymers are coated. Typical organic solvents which are useful in the preparation of the coating solutions employed in the present invention are benzene, methylene chloride, chloroform and the like. Copolymer solutions containing from about 1 to about 25 percent by weight of the copolymer in an inert organic solvent can be coated on substrates such as paper, polymeric films, metals and the like to form the imaging systems of the present invention. The polymeric coating, once applied to the substrate, is allowed to dry under ambient conditions. If desired, drying can be hastened by heating the substrate at temperatures slightly above room temperature e.g., at 25° to 50° C. The resulting imaging systems of the present invention undergo photoinitiated quantitative thermal decomposition at temperatures ranging from about 80° to 130° C. depending upon the specific copolymer employed. The resulting decomposition products are aldehydes and ketones which are vaporous under the imaging conditions employed in the imaging process.

Positive images of an image bearing original can be conveniently prepared employing the imaging system to the present invention. To obtain positive copies employing a direct imaging process, a colorant such as a pigment or dye as, for example, pigments such as carbon black, Sudan Black, Sudan Blue, Resiform Black, Heliogen Blue and the like or dyes such as methylene blue, crystal violet, indigo and the like can be admixed with the copolymer solution prior to coating on the substrate. The resulting imaging system can then be exposed to actinic radiation through an image bearing original whereby those regions of the imaging system corresponding to the non-image regions of the original absorb said radiation raising the temperature in said regions effecting a thermal degradation chain reaction which gives rise to amplification of the effect of the incident radiation. The resulting thermal degradation in the non-image regions of the peroxide copolymer film forms vaporous aldehydic and ketonic decomposition products which flash off the substrate resulting in the formation of a positive visible image of the original on the surface of the imaging system substrate.

Alternatively, a negative image can be obtained by admixing colorants with the copolymer solution that react with the aldehydic or ketonic decomposition products which are formed by photoinduced autogenous thermal degradation of the peroxide copolymer film during a reflex imaging process to result in less or no color in those regions of the imaging system wherein the decomposition products are generated. Thus, azomethine or arylidene derivatives of pyrazolones and the like included in the imaging system will undergo fadeout upon reaction with the aldehydes and/or ketone generated in the image areas. In this manner, a visible negative reproduction of the original can be obtained.

A positive imaging system can be conveniently obtained by admixing active methylenic color formers, e.g. pyrazolones with the copolymer solution prior to coating said solution on a suitable substrate. These methylenic color formers are reactive with the aldehydic and/or ketonic decomposition products obtained in accordance with the present invention to result in intensely colored compounds. Thus, upon reflex exposure to actinic radiation of an image bearing original, color is generated in the image areas by reaction of the decomposition products with the color formers in the imaging system resulting in a sharp visible positive of the original image.

Still another convenient negative imaging process is made possible through the imaging system of the present invention. In this instance, the imaging system of the present invention is prepared in such a manner as to be substantially transparent to radiation in the infrared region of the spectrum. This can easily be effected by including a dye in the copolymer solution which will transmit infrared radiation. The resulting image system can be negative-working by reflexively exposing the imaging system as it is superimposed upon an original image to infrared radiation which will pass through the imaging system and be absorbed by the imaged areas of the original, resulting in localized heating in the image regions and thereby initiating thermal degradation in those regions of the imaging system which correspond to the image region of said original resulting in the formation of vaporous decomposition products in the imaged regions and thereby forming a visible negative image of the original on the imaging system substrate.

Since the peroxide copolymers employed in the imaging system of the present invention undergo quantitative thermal decomposition with amplification by reason of the photo-initiated thermally assisted chain reaction at relatively low temperatures resulting in the formation of vaporous decomposition products, an imaging system is provided which does not require the use of catalysts, initiators, sensitizers and the like. Moreover, further heating of the imaging system or use of a solvent to remove the degradation product is generally not required. In instances where a pigmented imaging system is employed, it may be desirable after the decomposition products flash off to wash off any residual pigment left behind, but this is generally not considered strictly necessary.

The radiation source employed for exposing the imaging system of the present invention can be any radiation source which emits radiation, a substantial fraction of which is in the infrared region of the spectrum. Thus, for example, suitable radiation sources are quartz-iodide sources, PAR lamps, SR lamps and the like. These light sources are usually placed a distance of from about 2 to about 12 inches from the imaging system.

In the formation of the imaging system of the present invention, it is preferred that the copolymer solution be applied to the substrate so as to form a continuous copolymer film having a thickness of from about 0.05 to about 2 mils and preferably from about 0.10 to about 0.5 mils.

The imaging system of the present invention is primarily positive working although, as described hereinabove, one of the principal advantages of the present invention is the ease with which either positive or negative images can be obtained. Additionally, the imaging system of the present invention eliminates the need for the inclusion in such system of catalysts, initiators, and sensitizers. Moreover, because the decomposition products which result are vaporous under the conditions of the imaging process, no development procedure is necessary. Thus, the imaging system and the imaging processes which are made available by the present invention are quite versatile and suitable for reproduction of line copy by contact, reflection or reflex exposure.

The following examples further illustrate the present invention but should not be considered as imposing any limitations on the scope of the invention. Unless otherwise stated, all percentages and parts are by weight.

EXAMPLE 1

Styrene was copolymerized with oxygen in accordance with the following procedures.

Into a 250 ml. 3-necked round-bottom flask, equipped with a reflux condenser, a thermometer, a stirrer and a constant temperature oil bath, was charged 87.8 g of styrene and 0.34 g of $\alpha,\alpha'$-azobisisobutyronitrile. The reaction mixture was stirred at 50° C., while oxygen was passed into the system for a period of 24 hours. The reaction mixture was then cooled to room temperature and poured into 250 ml. of cold methanol (5° C.) under stirring. The styrene-oxygen copolymer was precipitated out in the form of a white solid. The copolymer was dissolved in benzene and then precipitated with methanol. This dissolution-precipitation procedure was repeated twice. Finally, the copolymer was redissolved in benzene to form a coating solution. A small portion of this copolymer solution was evaporated to dryness under reduced pressure for elemental analysis which yielded 72.73% C and 6.65H. Thus, the composition of this copolymer can be represented as $$[(C_8H_8)_{1.25}O_2]_n$$

The resulting peroxide copolymer was obtained in about 20 percent conversion. The copolymer is thermally sensitive and quantitatively decomposes at 130° to yield benzaldehyde and formaldehyde.

A photo-thermally sensitive copy sheet was prepared by adding 0.2 g of carbon black to 10 ml. of 10% styrene-oxygen copolymer solution in benzene and coated on Baryta paper.

Photo-thermographic images were prepared by contact exposing the copy sheet to an original via an 8–10 second exposure to a 1,000 watt quartz-iodide light source such as a Sun Gun available from Sylvania Division of General Telephone and Electronic Corp. The radiation was absorbed by the non-image areas of the copy sheet effecting photothermal decomposition of the polymeric coating in non-image areas forming benzaldehyde and formaldehyde vapors and resulting in a positive image on the copy sheet.

EXAMPLE 2

A coating composition as described in Example 1 was prepared but the inclusion of carbon black was omitted and instead, the polymeric composition was dyed blue using Sudan Blue which permits passage of infrared radiation but absorbs visible light in the range of 0.5 to 0.7 microns, thereby providing a blue copy sheet. Employing a reflex imaging mode, the copy sheet was superimposed upon an original. Thermographic images were generated with a 1–2 second exposure to an infrared light source. The infrared radiation passes through the copy sheet and is absorbed by the original in image configuration. The thus heated image portions of the original cause localized degradation in image configuration on the copy sheet forming benzaldehyde and formaldehyde vapors. The resulting copy sheet contained a negative blue image of the original.

EXAMPLE 3

An uncolored copy sheet was prepared employing the coating composition of Example 1 except omitting the carbon black and adding in lieu thereof, 0.1 g of 3-methyl-1-tolyl-5-pyrazolone.

The resulting copy sheet was photo-thermographically imaged as described in Example 2. The resulting aldehydic decomposition products reacted with the pyrazolone to form a yellow image in the image area resulting in a sharp contrasting positive image of the original.

EXAMPLE 4

A colored copy sheet was prepared employing the coating composition of Example 1 except omitting the carbon black and adding in lieu thereof, 0.1 g of 4-[4-(N,N-diethylamino)anilidene]-3-methyl-1-phenyl-5-pyrazolone imparting a purple color to the copy sheet.

The resulting copy sheet was photo-thermographically imaged as described in Example 2. The resulting aldehydic decomposition products reacted with the pyrazolone derivative to form colorless or bleached out image areas resulting in a sharp contrasting negative image of the original.

EXAMPLE 5

α-Methyl styrene was copolymerized with oxygen in accordance with the following procedure.

Into a 250 ml, 3-necked round-bottom flask, equipped with a stirrer, a reflux condenser, a thermometer, a gas inlet and an oil bath was charged 88.4 g of distilled α-methyl styrene and 0.162 g of α,α'-azobis isobutyronitrile. The reaction mixture was stirred at 50° C. while oxygen was passed into the system for a period of 24 hours. The reaction mixture was then cooled to room temperature and poured into 200 ml. of cold methanol under stirring. The α-methyl styrene-oxygen copolymer was precipitated out in the form of a white solid. The copolymer was dissolved in benzene and then precipitated with methanol. This dissolution-precipitation procedure was repeated twice. Finally, the copolymer was redissolved in benzene to form a coating solution.

The resulting peroxide copolymer was obtained in about 20 percent conversion. The copolymer is thermally sensitive and quantitatively decomposed at temperatures between about 80° to 100° yielding formaldehyde and acetophenone.

A photo-thermally sensitive copy sheet was prepared and imaged as disclosed in Example 1 but required only a 2 second exposure to yield a positive image.

What is claimed is:

1. A photo-induced thermally degradable imaging system comprising a photographically acceptable support suitable for positioning in an imaging mode which is provided with a continuous, water-insoluble film of a peroxide copolymer of oxygen and a vinyl aromatic monomer having the structural formula:

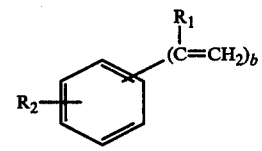

wherein $R_1$ can be hydrogen or an alkyl group containing from 1 to 4 carbon atoms, $R_2$ is hydrogen, an alkyl group containing from 1 to 4 carbons atoms, an aryl group containing from 6 to 12 carbon atoms or a halogen atom and b is an integer from 1 to 2.

2. An imaging system as defined in claim 1 additionally containing a colorant.

3. An imaging system as defined in claim 1 wherein the peroxide copolymer is a copolymer of oxygen and styrene.

4. An imaging system as defined in claim 1 wherein the peroxide copolymer is a copolymer of oxygen and alpha-methyl styrene.

5. An imaging system as defined in claim 1 additionally containing an organic compound reactive with aldehydes or ketones to form a colored reaction product.

6. An imaging system as defined in claim 1 additionally containing a colored organic compound reactive with aldehydes or ketones to form a reaction product having less color than said organic compound.

7. A positive imaging process comprising exposing to actinic radiation through an original image sheet, the imaging system defined in claim 2 thereby effecting absorption of said radiation by those regions of the imaging system corresponding to the non-image regions of said original image sheet, whereby the peroxide copolymer film undergoes photo-induced autogenous thermal degradation forming vaporous decomposition products of said copolymer and resulting in the formation of a positive visible image of the original on the surface of the imaging system.

8. A negative imaging process comprising reflexively exposing to actinic radiation from an original image sheet, the imaging system defined in claim 6 thereby effecting absorption of said radiation by those regions of the imaging system corresponding to the image regions of said original image sheet whereby the peroxide copolymer film undergoes photo-induced autogenous thermal degradation forming vaporous aldehydic and/or ketonic decomposition products which react with the organic compound in the imaging system to result in regions of less or no color in those regions of the imaging system corresponding to the image regions of the original image sheet, thereby resulting in the formation of a visible negative image of the original on the surface of the imaging system.

9. A negative imaging process comprising reflexively exposing an infrared transparent imaging system as defined in claim 1 superimposed upon an original image sheet to infrared radiation which passes through the imaging system and is absorbed by the image regions of said original image sheet causing autogenous thermal degradation in those regions of the imaging system corresponding to the imaged regions of said original image sheet, resulting in the formation of a visible negative image of the original on the surface of the imaging system.

10. A positive imaging process comprising reflexively exposing to actinic radiation from an original image sheet, the imaging system defined in claim 6 thereby effecting absorption of said radiation by those regions of the imaging system corresponding to the image regions of said original image sheet whereby the peroxide copolymer film undergoes photo-induced autogenous thermal degradation forming aldehydic and/or ketonic decomposition products which react with the organic compound in the imaging system to form regions of color in those regions of the imaging system corresponding to the image regions of said original, thereby forming a visible positive image of the original on the surface of the imaging system.

* * * * *

Disclaimer 4,132,549.—*Frank J. Loprest*, Binghamton, N.Y., and *Eugene F. McInerney*, Chagrin Falls, Ohio. IMAGING SYSTEM. Patent dated Jan. 2, 1979. Disclaimer filed Sept. 30, 1982, by the assignee, *Eastman Kodak Co.*

Hereby enters this disclaimer to all claims of said patent.
[*Official Gazette March 1, 1983.*]